United States Patent
Li et al.

(10) Patent No.: US 9,898,944 B2
(45) Date of Patent: Feb. 20, 2018

(54) DETECTING CIRCUIT, DETECTING METHOD AND DISPLAY DEVICE

(71) Applicants: BOE TECHNOLOGY GROUP CO., LTD., Beijing (CN); BOE (Hebei) Mobile Display Technology Co., Ltd., Gu'An, Hebei (CN)

(72) Inventors: Liliang Li, Beijing (CN); Guiyun Wang, Beijing (CN); Guowen Yang, Beijing (CN); Gang Li, Beijing (CN); Yongjun Liao, Beijing (CN)

(73) Assignees: BOE TECHNOLOGY GROUP CO., LTD., Beijing (CN); BOE (HEBEI) MOBILE DISPLAY TECHNOLOGY CO., LTD., Gu'An, Hebei (CN)

( * ) Notice: Subject to any disclaimer, the term of this patent is extended or adjusted under 35 U.S.C. 154(b) by 0 days.

(21) Appl. No.: 15/159,166

(22) Filed: May 19, 2016

(65) Prior Publication Data
US 2017/0025051 A1    Jan. 26, 2017

(30) Foreign Application Priority Data

Jul. 20, 2015    (CN) .......................... 2015 1 0428068

(51) Int. Cl.
*G01R 31/26*    (2014.01)
*G09G 3/00*    (2006.01)
(Continued)

(52) U.S. Cl.
CPC .......... *G09G 3/006* (2013.01); *G01R 31/2825* (2013.01); *G09G 3/3611* (2013.01);
(Continued)

(58) Field of Classification Search
CPC .......... G01R 19/16519; G01R 31/2621; G01R 31/2635; G09G 3/3241; G09G 3/325;
(Continued)

(56) References Cited

U.S. PATENT DOCUMENTS

2004/0017531 A1    1/2004    Nagata et al.
2008/0265253 A1*   10/2008   Tian ...................... G02F 1/1345
                                                          257/59
(Continued)

FOREIGN PATENT DOCUMENTS

CN        1881060 A        12/2006
CN        102629003 A       8/2012
(Continued)

OTHER PUBLICATIONS

First Office Action dated Mar. 13, 2017 in corresponding Chinese Application No. 201510428068.4.

*Primary Examiner* — Tung X Nguyen
(74) *Attorney, Agent, or Firm* — Nath, Goldberg & Meyer; Joshua B. Goldberg (57) ABSTRACT

The present invention provides a detecting circuit, a detecting method and a display device, and the detecting circuit includes data signal input buses, switching units and control units, wherein the data signal input buses are used to provide data signals to the data lines and a predetermined number of data lines corresponding to a central region of the display panel constitute a first data line group; the switching units are arranged between the data lines and corresponding data signal input buses, all of which are divided into two switching unit groups, and all switching units in correspondence with the data lines in the first data line group constitute a first switching unit group; and the control units are used to control all switching units of corresponding switching unit groups to be turned on or turned off simultaneously.

9 Claims, 3 Drawing Sheets

(51) Int. Cl.
*G01R 31/28* (2006.01)
*G09G 3/36* (2006.01)
(52) U.S. Cl.
CPC ............... *G09G 2300/0426* (2013.01); *G09G 2320/0209* (2013.01); *G09G 2330/12* (2013.01)
(58) Field of Classification Search
CPC .. G09G 2330/12; G09G 3/006; G09G 3/3233; H04N 9/3191
See application file for complete search history.

(56) References Cited

U.S. PATENT DOCUMENTS

| 2011/0084936 A1* | 4/2011 | Chang | G06F 3/0416 345/174 |
| 2012/0068954 A1* | 3/2012 | Chang | G06F 3/0416 345/173 |

FOREIGN PATENT DOCUMENTS

| CN | 202533678 U | 11/2012 |
| CN | 103137050 A | 6/2013 |
| KR | 10-2006-0115518 | 11/2006 |

* cited by examiner

DETECTING CIRCUIT, DETECTING METHOD AND DISPLAY DEVICE

FIELD OF THE INVENTION

The present invention relates to the field of display technology, and specifically relates to a detecting circuit, a detecting method and a display device.

BACKGROUND OF THE INVENTION

Figure 1:
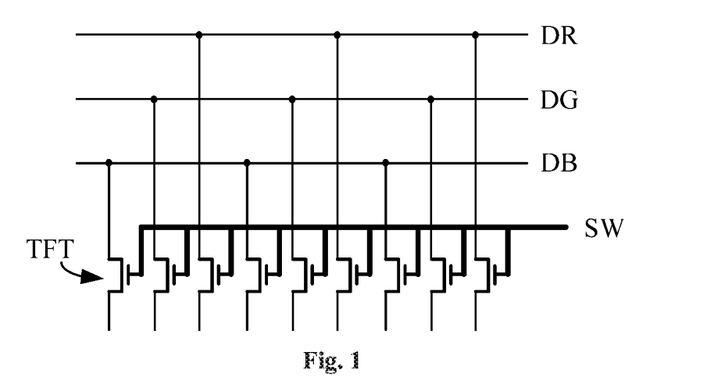
FIG. 1 is a schematic diagram of a detecting circuit performing liquid crystal cell test in the prior art.

A process of liquid crystal cell test is an important part of the manufacture process of a display device, which is critical to the yield of products. FIG. 1 is a schematic diagram of a detecting circuit performing liquid crystal cell test in the prior art, and as shown in FIG. 1, the detecting circuit includes a plurality of data signal input buses DR/DG/DB and a plurality of corresponding switching transistors TFT, each data line on the display panel is electrically connected to a corresponding data signal input bus through one switching transistor, respectively, wherein the switching transistors correspond to the data lines on the display panel one to one and are used to control electrical connections between the data signal input buses and corresponding data lines, and the control electrodes of all switching transistors in the detecting circuit are all connected to a switch control signal terminal SW. During the liquid crystal cell test, all switching transistors are turned on under the control of the switching control signal terminal SW, and, at this time, the display panel presents a pure-color image, such as a red image, a green image, a blue image or grey images having different grayscales, by inputting predetermined data signals through respective data signal input buses, and then a detection is performed for the mura on the liquid crystal.

A process of crosstalk detection is also an essential part of the manufacture process of a display device, which is used to detect whether a crosstalk occurs in the display panel during display. So far, the detection of crosstalk for a display panel only can be performed when a specific detection image is displayed on the display panel. The specific detection image includes a central region and a peripheral region surrounding the central region, wherein all pixels corresponding to the central region have a first grayscale value, which is generally selected as 0 or 255, and all pixels corresponding to the peripheral region have a second grayscale value different from the first grayscale value.

When the specific detection image is displayed on the display panel, it indicates that a crosstalk occurs in the display panel if the image presented on the display panel has a different brightness in the areas at left and right sides and/or upper and lower sides of the central region from the remaining areas of the central region; otherwise, it indicates that no crosstalk occurs in the display panel.

Since conventional detecting circuits for performing liquid crystal cell test only enables the display panel to display a pure-color image rather than a complex image, for example, the specific detection image required in the detection of crosstalk, the detection of crosstalk only can be performed in a later stage (after fixing the integrated control circuit) of the manufacture procedure in the prior art. Specifically, the specific detection image required in the detection of crosstalk is displayed on the display panel under the control of the integrated control circuit provided in a later stage of the manufacture procedure.

However, since the crosstalk can be detected only in a later stage of the manufacture procedure in the prior art, in which most processes have been performed for the display panel, the display panel may consume more resources in the whole manufacture process, and the production cost is increased.

SUMMARY OF THE INVENTION

The present invention provides a detecting circuit, a detecting method and a display device, which make improvements on conventional detecting circuits used for liquid crystal cell test, so as to enable the detecting circuit to perform a detection of crosstalk on a display panel, such that the detection of crosstalk for the display panel can be performed in an early stage of the manufacture procedure, and thus defective products having crosstalk can be detected in time to solve the technical problem of high production cost of conventional display panels.

To achieve the above object, the present invention provides a detecting circuit used to perform a detection of crosstalk on a display panel, which includes:

a plurality of data signal input buses, which are used to provide data signals to corresponding data lines on the display panel, a predetermined number of data lines corresponding to a central region of the display panel constituting a first data line group;

a plurality of switching units, which have the same number as the data lines and correspond to the data lines one to one, the switching units being arranged between the data lines and corresponding data signal input buses, being used to control electrical connections between the data lines and the corresponding data signal input buses, all switching units being divided into two switching unit groups, and all switching units in correspondence with the data lines in the first data line group constituting a first switching unit group; and a plurality of control units, which have the same number as the switching unit groups and correspond to the switching unit groups one to one, and are used to control all switching units of corresponding switching unit groups to be turned on or turned off simultaneously.

Optionally, all switching units are divided into first and second switching unit groups, wherein all switching units corresponding to the data lines of the first data line group constitute the first switching unit group and the remaining switching units constitute the second switching unit group;

the control units include a first control unit and a second control unit;

the first control unit is used to control all switching units of the first switching unit group to be turned on or turned off simultaneously; and the second control unit is used to control all switching units of the second switching unit group to be turned on or turned off simultaneously.

Optionally, all switching units are divided into first, second and third switching unit groups;

all switching units corresponding to the data lines of the first data line group constitute the first switching unit group, all switching units corresponding to the data lines which correspond to a peripheral region at one side of the central region of the display panel constitute the second switching unit group, and all switching units corresponding to the data lines which correspond to a peripheral region at the other side of the central region of the display panel constitute the third switching unit group;

the control units include a first control unit, a second control unit and a third control unit;

the first control unit is used to control all switching units of the first switching unit group to be turned on or turned off simultaneously;

the second control unit is used to control all switching units of the second switching unit group to be turned on or turned off simultaneously; and the third control unit is used to control all switching units of the third switching unit group to be turned on or turned off simultaneously.

Optionally, the switching unit comprises a transistor;

a control electrode of the transistor is connected to the corresponding control unit, a first electrode of the transistor is connected to the corresponding data line, and a second electrode of the transistor is connected to the corresponding data signal input bus.

To achieve the above object, the present invention further provides a detecting method used to perform a detection of crosstalk on a display panel, which is based on the above detecting circuit, the detecting method comprising:

in a first stage, all switching units of the first switching unit group are controlled to be turned on simultaneously by the first control unit, and all switching units of the second switching unit group are controlled to be turned on simultaneously by the second control unit;

in a second stage, all switching units of the first switching unit group are controlled to be turned off simultaneously by the first control unit, and all switching units of the second switching unit group are controlled to be turned on simultaneously by the second control unit; and in a third stage, all switching units of the first switching unit group are controlled to be turned on simultaneously by the first control unit, and all switching units of the second switching unit group are controlled to be turned on simultaneously by the second control unit;

alternatively, in the first stage, all switching units of the first switching unit group are controlled to be turned off simultaneously by the first control unit, and all switching units of the second switching unit group are controlled to be turned off simultaneously by the second control unit;

in the second stage, all switching units of the first switching unit group are controlled to be turned on simultaneously by the first control unit, and all switching units of the second switching unit group are controlled to be turned off simultaneously by the second control unit; and in the third stage, all switching units of the first switching unit group are controlled to be turned off simultaneously by the first control unit, and all switching units of the second switching unit group are controlled to be turned off simultaneously by the second control unit.

To achieve the above object, the present invention further provides a detecting method used to perform a detection of crosstalk on a display panel, which is based on the above detecting circuit, the detecting method comprising:

in a first stage, all switching units of the first switching unit group are controlled to be turned on simultaneously by the first control unit, all switching units of the second switching unit group are controlled to be turned on simultaneously by the second control unit, and all switching units of the third switching unit group are controlled to be turned on simultaneously by the third control unit;

in a second stage, all switching units of the first switching unit group are controlled to be turned off simultaneously by the first control unit, all switching units of the second switching unit group are controlled to be turned on simultaneously by the second control unit, and all switching units of the third switching unit group are controlled to be turned on simultaneously by the third control unit; and in a third stage, all switching units of the first switching unit group are controlled to be turned on simultaneously by the first control unit, all switching units of the second switching unit group are controlled to be turned on simultaneously by the second control unit, and all switching units of the third switching unit group are controlled to be turned on simultaneously by the third control unit;

alternatively, in the first stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit;

in the second stage, all switching units of the first switching unit group are controlled to be turned on simultaneously by the first control unit, all switching units of the second switching unit group are controlled to be turned off simultaneously by the second control unit, and all switching units of the third switching unit group are controlled to be turned off simultaneously by the third control unit; and in the third stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit.

To achieve the above object, the present invention further provides a display device, which includes a detecting circuit used to perform a detection of crosstalk on a display panel, the detecting circuit being the above detecting circuit.

The beneficial effect of the present invention is as follows:

the present invention provides a detecting circuit, a detecting method and a display device, which make improvements on conventional detecting circuits used for liquid crystal cell test, so as to enable the detecting circuit to perform a detection of crosstalk on a display panel, such that the detection of crosstalk for the display panel can be performed in an early stage of the manufacture procedure, and thus defective products having crosstalk can be detected in time to solve the technical problem of high production cost of conventional display panels.

DETAILED DESCRIPTION OF THE EMBODIMENTS

To make those skilled in the art better understand the technical solutions of the present invention, a detecting circuit, a detecting method and a display device provided by the present invention will be described in detail below in conjunction with the accompanying drawings.

Figure 2:
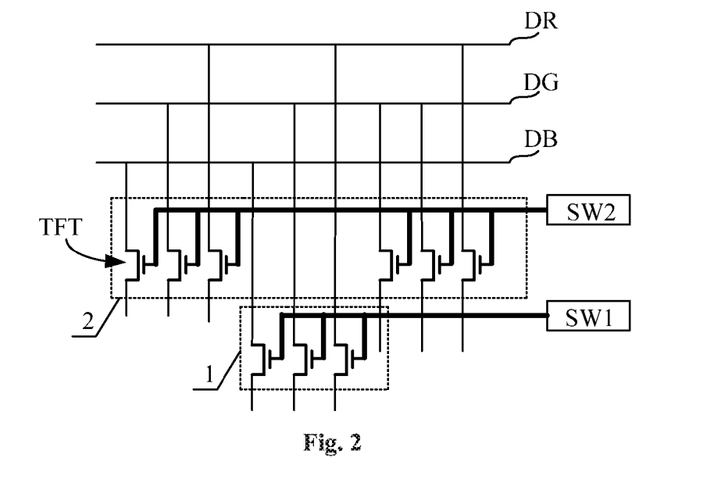
FIG. 2 is a structural schematic diagram of a detecting circuit provided by a first embodiment of the present invention.

FIG. 2 is a structural schematic diagram of a detecting circuit provided by a first embodiment of the present invention. As shown in FIG. 2, the detecting circuit is an improvement based on a conventional detecting circuit used for liquid crystal cell test, which not only reserves the original function of liquid crystal cell test, but also functions to perform a detection of crosstalk on a display panel. It needs to be noted that in the case of implementing the function of liquid crystal cell test, an operation to the detecting circuit provided by the present embodiment is the same as that in the prior art, and is not described herein.

Specifically, the detecting circuit includes a plurality of data signal input buses DR/DG/DB, a switching unit(s) and a control unit(s). Here, each data signal input bus DR/DG/DB is used to provide data signals to corresponding data lines on the display panel (one data signal input bus corresponds to a plurality of data lines), and a predetermined number of data lines corresponding to a predetermined number of pixels, which correspond to a central region of the display panel, constitute a first data line group; the switching units have the same number as the data lines and correspond to the data lines one to one, the switching units being arranged between the data lines and corresponding data signal input buses, being used to control electrical connections between the data lines and the corresponding data signal input buses, and all switching units being divided into two switching unit groups, wherein the first switching unit group includes all switching units corresponding to the data lines of the first data line group; and the control units have the same number as the switching unit groups and correspond to the switching unit groups one to one, and are used to control all switching units of corresponding switching unit groups to be turned on or turned off simultaneously.

It needs to be noted that the condition of three data signal input buses in FIG. 2 is only illustrative, and the present invention is not limited thereto.

In the technical solutions of the present invention, all switching units corresponding to the data lines of the first data line group constitute the first switching unit group and the remaining switching units constitute at least one switching unit group, and meanwhile, the switching unit groups are controlled by corresponding control units, respectively, so as to enable the display panel to display a detection image used for a detection of crosstalk.

Optionally, all switching units are divided into a first switching unit group 1 and a second switching unit group 2, wherein all switching units corresponding to the data lines of the first data line group constitute the first switching unit group 1 and the remaining switching units constitute the second switching unit group 2; the control units include a first control unit SW1 and a second control unit SW2; the first control unit SW1 is used to control all switching units of the first switching unit group 1 to be turned on or turned off simultaneously; and the second control unit SW2 is used to control all switching units of the second switching unit group 2 to be turned on or turned off simultaneously.

It needs to be noted that in FIG. 2, the first switching unit group 1 includes three switching units and the second switching unit group 2 includes six switching units, which is only illustrative and the present invention is not limited thereto.

Optionally, the switching unit comprises a transistor TFT, a control electrode of the transistor TFT is connected to the corresponding control unit, a first electrode of the transistor TFT is connected to the corresponding data line, and a second electrode of the transistor TFT is connected to the corresponding data signal input bus.

It needs to be noted that the present embodiment will be described by taking an N-type thin film transistor as an example, but it will not limit the technical solution of the present invention.

The process of displaying, by using the detection circuit provided by the present embodiment, a specific detection image used for the detection of crosstalk will be described in detail below in conjunction with the accompanying drawings. Here, it assumes that the display panel is of normally black mode, the display panel has M gate lines and N data lines, and M*N pixels are defined by the M gate lines and N data lines. Here, it assumes that the $n_1$-th data line to the $n_2$-th data line, corresponding to the pixels in the central region of the display panel (i.e., pixels corresponding to a central region of the specific detection image on the display panel), constitute the first data line group, where $1<n_1<n_2<N$.

Figure 3:
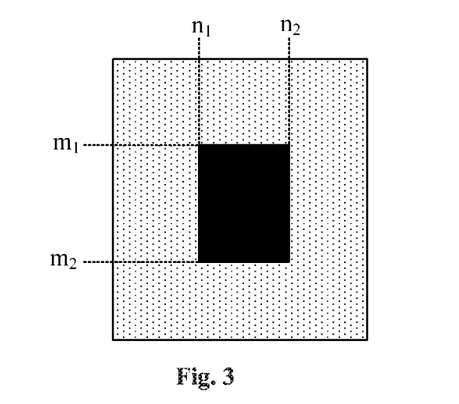
FIG. 3 is a schematic diagram of a specific detection image displayed by a display panel.
Figure 4:
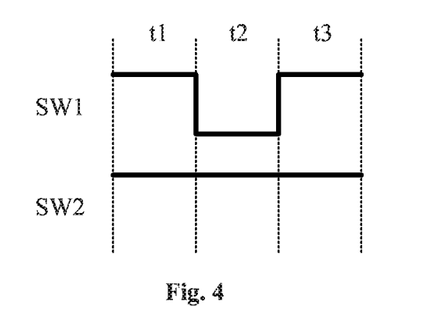
FIG. 4 is an operation timing diagram of the detecting circuit provided by the first embodiment of the present invention when the specific detection image shown in FIG. 3 is displayed by the display panel.

FIG. 3 is a schematic diagram of a specific detection image displayed by the display panel, and FIG. 4 is an operation timing diagram of the detecting circuit provided by the first embodiment of the present invention when the specific detection image shown in FIG. 3 is displayed by the display panel. As shown in FIG. 3, all pixels corresponding to the central region of the specific detection image have a grayscale value of 0 (display black), and all pixels corresponding to the peripheral region have a second grayscale value (which is not 0). Taking the display panel displaying a frame of image as an example and as shown in FIG. 4, the detection process of the detecting circuit is divided into three stages.

In a first stage t1, the first gate line to the $(m_1-1)$-th gate line on the display panel are driven line by line. At this time, the first control unit SW1 outputs a high-level control signal to control all transistors TFT of the first switching unit group 1 to be turned on simultaneously, and the second control unit SW2 outputs a high-level control signal to control all transistors TFT of the second switching unit group 2 to be turned on simultaneously.

In the first stage t1, each data line of the display panel may receive the data signal, which is provided by the corresponding data signal input bus and may cause the corresponding pixel to have the second grayscale value, through corresponding transistor TFT. At this time, each of the pixels positioned in the first row to the $(m_1-1)$-th row of the display panel may receive corresponding data signal, such that the pixels positioned in the first row to the $(m_1-1)$-th row of the display panel have the second grayscale value.

In a second stage t2, the $m_1$-th gate line to the $m_2$-th gate line on the display panel are driven line by line, where $1<m_1<m_2<M$. At this time, the first control unit SW1 outputs a low-level control signal to control all transistors TFT of the first switching unit group 1 to be turned off simultaneously, and the second control unit SW2 outputs a high-level control signal to control all transistors TFT of the second switching unit group 2 to be turned on simultaneously.

In the second stage t2, each of the first to $(n_1-1)$-th data lines and the $(n_2+1)$-th to N-th data lines of the display panel may receive the data signal, which is provided by the corresponding data signal input bus and may cause the corresponding pixel to have the second grayscale value, through corresponding transistor TFT, whereas the $n_1$-th to $n_2$-th data lines cannot receive data signals. At this time, the pixels positioned in the $m_1$-th row to the $m_2$-th row and meanwhile positioned in the $n_1$-th column to the $n_2$-th column cannot receive data signals, such that these pixels have a grayscale value of 0 and the remaining pixels positioned in the $m_1$-th row to the $m_2$-th row have the second grayscale value.

In a third stage t3, the $(m_1+1)$-th gate line to the M-th gate line on the display panel are driven line by line. At this time, the first control unit SW1 outputs a high-level control signal to control all transistors TFT of the first switching unit group 1 to be turned on simultaneously, and the second control unit SW2 outputs a high-level control signal to control all transistors TFT of the second switching unit group 2 to be turned on simultaneously.

In the third stage t3, each data line of the display panel may receive the data signal provided by the corresponding data signal input bus through corresponding transistor TFT. At this time, each of the pixels positioned in the $(m_1+1)$-th row to the M-th row of the display panel may receive corresponding data signal, such that the pixels positioned in the $(m_1+1)$-th row to the M-th row of the display panel have the second grayscale value.

It can be seen from the above that the display panel may display a specific detection image in which pixels at the central region have a grayscale value of 0 and pixels at the peripheral region have the second grayscale value. At this time, a detecting worker may detect whether a crosstalk occurs in the display panel according to the specific detection image displayed by the display panel.

Figure 5:
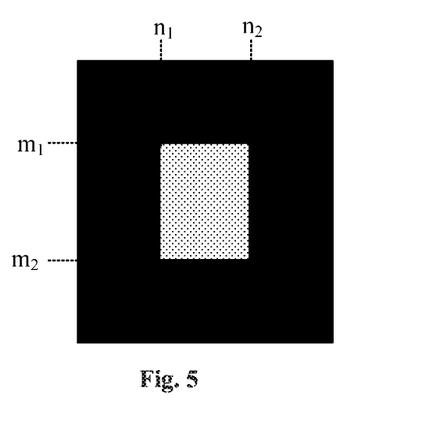
FIG. 5 is a schematic diagram of another specific detection image displayed by the display panel.
Figure 6:
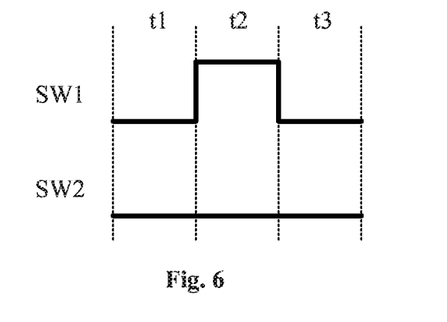
FIG. 6 is an operation timing diagram of the detecting circuit provided by the first embodiment of the present invention when the specific detection image shown in FIG. 5 is displayed by the display panel.

FIG. 5 is a schematic diagram of another specific detection image displayed by the display panel, and FIG. 6 is an operation timing of the detecting circuit provided by the first embodiment of the present invention when the specific detection image shown in FIG. 5 is displayed by the display panel. As shown in FIG. 5, the pixels corresponding to the central region of the specific detection image have the second grayscale value, and the pixels corresponding to the peripheral region have a grayscale value of 0. Taking the display panel displaying a frame of image as an example and as shown in FIG. 6, the detection process of the detecting circuit is divided into three stages.

In a first stage t1, the first gate line to the $(m_1-1)$-th gate line on the display panel are driven line by line. At this time, the first control unit SW1 outputs a low-level control signal to control all transistors TFT of the first switching unit group 1 to be turned off simultaneously, and the second control unit SW2 outputs a low-level control signal to control all transistors TFT of the second switching unit group 2 to be turned off simultaneously.

In the first stage t1, all data lines of the display panel cannot receive the data signals provided by the corresponding data signal input buses. At this time, the pixels positioned in the first row to the $(m_1-1)$-th row on the display panel cannot receive corresponding data signals, such that the pixels positioned in the first row to the $(m_1-1)$-th row on the display panel have a grayscale value of 0.

In a second stage t2, the $m_1$-th gate line to the $m_2$-th gate line positioned on the display panel are driven line by line. At this time, the first control unit SW1 outputs a high-level control signal to control all transistors TFT of the first switching unit group 1 to be turned on simultaneously, and the second control unit SW2 outputs a low-level control signal to control all transistors TFT of the second switching unit group 2 to be turned off simultaneously.

In the second stage t2, each of the $n_1$-th data line to the $n_2$-th data line may receive the data signal, which is provided by the corresponding data signal input bus and may cause the corresponding pixel to have the second grayscale value, through corresponding transistor TFT, whereas the first to $(n_1-1)$-th data lines and the $(n_2+1)$-th to N-th data lines cannot receive corresponding data signals. At this time, the pixels positioned in the $m_1$-th row to the $m_2$-th row and meanwhile positioned in the $n_1$-th column to the $n_2$-th column receive data signals, such that these pixels have the second grayscale value and the remaining pixels positioned in the $m_1$-th row to the $m_2$-th row have a grayscale value of 0.

In a third stage t3, the $(m_1+1)$-th gate line to the M-th gate line on the display panel are driven line by line. At this time, the first control unit SW1 outputs a low-level control signal to control all transistors TFT of the first switching unit group 1 to be turned off simultaneously, and the second control unit SW2 outputs a low-level control signal to control all transistors TFT of the second switching unit group 2 to be turned off simultaneously.

In the third stage t3, each data line of the display panel cannot receive the data signal provided by the corresponding data signal input bus. At this time, each of the pixels positioned in the $(m_1+1)$-th row to the M-th row of the display panel cannot receive corresponding data signal, and the pixels positioned in the $(m_1+1)$-th row to the M-th row of the display panel have a grayscale value of 0.

It can be seen from the above that the display panel may display a specific detection image in which pixels at the central region have the second grayscale value and pixels at the peripheral region have a grayscale value of 0. At this time, a detecting worker may detect whether a crosstalk occurs in the display panel according to the specific detection image displayed by the display panel.

It needs to be noted that, in the above two examples, a region, which is defined by the pixels positioned in the $m_1$-th row to the $m_2$-th row and meanwhile positioned in the $n_1$-th column to the $n_2$-th column on the display panel, corresponds to the "central region" of the specific detection image, and the location and size of the central region may be changed by adjusting the values of $n_1$, $n_2$, $m_1$ and $m_2$.

Figure 7:
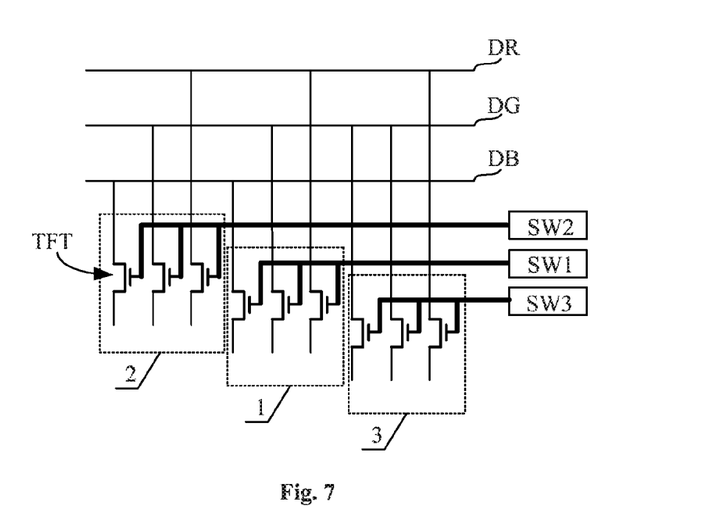
FIG. 7 is a structural schematic diagram of a detecting circuit provided by a second embodiment of the present invention.

FIG. 7 is a structural schematic diagram of a detecting circuit provided by a second embodiment of the present invention. As shown in FIG. 7, the difference of the detecting circuit of FIG. 7 from that of FIG. 2 is that all switching units of the detecting circuit of FIG. 7 are divided into a first switching unit group 1, a second switching unit group 2 and a third switching unit group 3, wherein all switching units corresponding to the data lines of the first data line group (i.e., data lines corresponding to the pixels which correspond to the central region) constitute the first switching unit group 1, all switching units corresponding to the data lines which correspond to a peripheral region at one side of the central region constitute the second switching unit group 2, and all switching units corresponding to the data lines which correspond to a peripheral region at the other side of the central region constitute the third switching unit group 3.

It needs to be noted that in FIG. 7, the first switching unit group 1 includes three switching units, the second switching unit group 2 includes three switching units and the third switching unit group 3 includes three switching units, which is only illustrative and the present invention is not limited thereto.

Accordingly, the control units of the detecting circuit include a first control unit SW1, a second control unit SW2 and a third control unit SW3, wherein the first control unit SW1 is used to control all switching units of the first switching unit group 1 to be turned on or turned off simultaneously; the second control unit SW2 is used to control all switching units of the second switching unit group 2 to be turned on or turned off simultaneously; and the third control unit SW3 is used to control all switching units of the third switching unit group 3 to be turned on or turned off simultaneously.

The present embodiment will be described by taking a switching unit consisting of an N-type thin film transistor TFT as an example.

The process of displaying a specific detection image used for the detection of crosstalk by using the detection circuit provided by the present embodiment will be described in detail below in conjunction with the accompanying drawings. Here, it assumes that the display panel is of normally black mode, the display panel has M gate lines and N data lines, and M*N pixels are defined by the M gate lines and N data lines. Here, it assumes that the $n_1$-th data line to the $n_2$-th data line, corresponding to the pixels in the central region of the display panel (i.e., pixels corresponding to a central region of the specific detection image on the display panel), constitute the first data line group, where $1<n_1<n_2<N$.

At this time, all switching units corresponding to the $n_1$-th to $n_2$-th data lines constitute the first switching unit group 1, all switching units corresponding to the first to $(n_1-1)$-th data lines constitute the second switching unit group 2, and all switching units corresponding to the $(n_2+1)$-th to N-th data lines constitute the third switching unit group 3.

Figure 8:
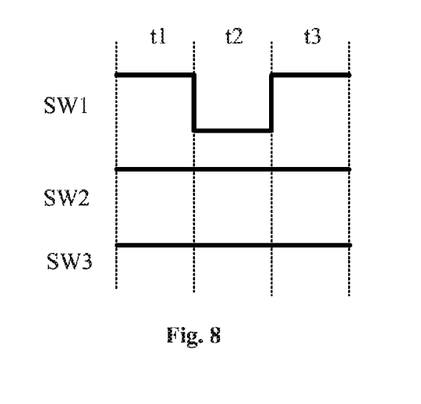
FIG. 8 is an operation timing diagram of the detecting circuit provided by the second embodiment of the present invention when the specific detection image shown in FIG. 3 is displayed by the display panel.

FIG. 8 is an operation timing diagram of the detecting circuit provided by the second embodiment of the present invention when the specific detection image shown in FIG. 3 is displayed by the display panel. As shown in FIG. 8, all pixels corresponding to the central region of the specific detection image have a grayscale value of 0 (display black), and all pixels corresponding to the peripheral region have a second grayscale value (which is not 0). Taking the display panel displaying a frame of image as an example and as shown in FIG. 8, the detection process of the detecting circuit is divided into three stages.

In a first stage t1, the first gate line to the $(m_1-1)$-th gate line on the display panel are driven line by line. At this time, the first control unit SW1 outputs a high-level control signal to control all transistors TFT of the first switching unit group 1 to be turned on simultaneously, the second control unit SW2 outputs a high-level control signal to control all transistors TFT of the second switching unit group 2 to be turned on simultaneously, and the third control unit SW3 outputs a high-level control signal to control all transistors TFT of the third switching unit group 3 to be turned on simultaneously.

In the first stage t1, each data line of the display panel may receive the data signal, which is provided by the corresponding data signal input bus and may cause the corresponding pixel to have the second grayscale value, through corresponding transistor TFT. At this time, each of the pixels positioned in the first row to the $(m_1-1)$-th row of the display panel may receive corresponding data signal, such that the pixels positioned in the first row to the $(m_1-1)$-th row of the display panel have the second grayscale value.

In a second stage t2, the $m_1$-th gate line to the $m_2$-th gate line on the display panel are driven line by line, where $1<m_1<m_2<M$. At this time, the first control unit SW1 outputs a low-level control signal to control all transistors TFT of the first switching unit group 1 to be turned off simultaneously, the second control unit SW2 outputs a high-level control signal to control all transistors TFT of the second switching unit group 2 to be turned on simultaneously, and the third control unit SW3 outputs a high-level control signal to control all transistors TFT of the third switching unit group 3 to be turned on simultaneously.

In the second stage t2, each of the first to $(n_1-1)$-th data lines and the $(n_2+1)$-th to N-th data lines of the display panel may receive the data signal, which is provided by the corresponding data signal input bus and may cause the corresponding pixel to have the second grayscale value, through corresponding transistor TFT, whereas the $n_1$-th to $n_2$-th data lines cannot receive data signals. At this time, the pixels positioned in the $m_1$-th row to the $m_2$-th row and meanwhile positioned in the $n_1$-th column to the $n_2$-th column cannot receive data signals, such that these pixels have a grayscale value of 0 and the remaining pixels positioned in the $m_1$-th row to the $m_2$-th row have the second grayscale value.

In a third stage t3, the $(m_1+1)$-th gate line to the Math gate line on the display panel are driven line by line. At this time, the first control unit SW1 outputs a high-level control signal to control all transistors TFT of the first switching unit group 1 to be turned on simultaneously, the second control unit SW2 outputs a high-level control signal to control all transistors TFT of the second switching unit group 2 to be turned on simultaneously, and the third control unit SW3 outputs a high-level control signal to control all transistors TFT of the third switching unit group 3 to be turned on simultaneously.

In the third stage t3, each data line of the display panel may receive the data signal provided by the corresponding data signal input bus through corresponding transistor TFT. At this time, each of the pixels positioned in the $(m_1+1)$-th row to the M-th row of the display panel may receive corresponding data signal, such that the pixels positioned in the $(m_1+1)$-th row to the M-th row of the display panel have the second grayscale value.

It can be seen from the above that the display panel may display a specific detection image in which pixels at the central region have a grayscale value of 0 and pixels at the peripheral region have the second grayscale value. At this time, a detecting worker may detect whether a crosstalk occurs in the display panel according to the specific detection image displayed by the display panel.

Figure 9:
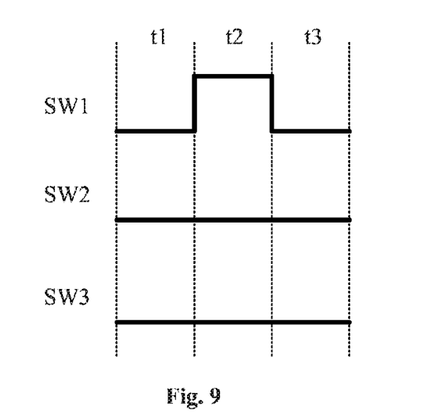
FIG. 9 is an operation timing diagram of the detecting circuit provided by the second embodiment of the present invention when the specific detection image shown in FIG. 5 is displayed by the display panel.

FIG. 9 is an operation timing diagram of the detecting circuit provided by the second embodiment of the present invention when the specific detection image shown in FIG. 5 is displayed by the display panel. As shown in FIG. 5, the pixels corresponding to the central region of the specific detection image have the second grayscale value, and the pixels corresponding to the peripheral region have a grayscale value of 0. Taking the display panel displaying a frame of image as an example and as shown in FIG. 9, the detection process of the detecting circuit is divided into three stages.

In a first stage t1, the first gate line to the $(m_1-1)$-th gate line on the display panel are driven line by line. At this time, the first control unit SW1 outputs a low-level control signal to control all transistors TFT of the first switching unit group 1 to be turned off simultaneously, the second control unit SW2 outputs a low-level control signal to control all transistors TFT of the second switching unit group 2 to be turned off simultaneously, and the third control unit SW3 outputs a low-level control signal to control all transistors TFT of the third switching unit group 3 to be turned off simultaneously.

In the first stage t1, all data lines of the display panel cannot receive the data signals provided by the corresponding data signal input buses. At this time, the pixels positioned in the first row to the ($m_1$−1)-th row on the display panel cannot receive corresponding data signals, such that the pixels positioned in the first row to the ($m_1$−1)-th row on the display panel have a grayscale value of 0.

In a second stage t2, the $m_1$-th gate line to the $m_2$-th gate line on the display panel are driven line by line, where 1<$m_1$<$m_2$<M. At this time, the first control unit SW1 outputs a high-level control signal to control all transistors TFT of the first switching unit group 1 to be turned on simultaneously, the second control unit SW2 outputs a low-level control signal to control all transistors TFT of the second switching unit group 2 to be turned off simultaneously, and the third control unit SW3 outputs a low-level control signal to control all transistors TFT of the third switching unit group 3 to be turned off simultaneously.

In the second stage t2, each of the $n_1$-th data line to the $n_2$-th data line may receive the data signal, which is provided by the corresponding data signal input bus and may cause the corresponding pixel to have the second grayscale value, through corresponding transistor TFT, whereas the first to ($n_1$−1)-th data lines and the ($n_2$+1)-th to N-th data lines cannot receive corresponding data signals. At this time, the pixels positioned in the $m_1$-th row to the $m_2$-th row and meanwhile positioned in the $n_1$-th column to the $n_2$-th column receive corresponding data signals, such that these pixels have the second grayscale value and the remaining pixels positioned in the $m_1$-th row to the $m_2$-th row have a grayscale value of 0.

In a third stage t3, the ($m_1$+1)-th gate line to the M-th gate line on the display panel are driven line by line. At this time, the first control unit SW1 outputs a low-level control signal to control all transistors TFT of the first switching unit group 1 to be turned off simultaneously, the second control unit SW2 outputs a low-level control signal to control all transistors TFT of the second switching unit group 2 to be turned off simultaneously, and the third control unit SW3 outputs a low-level control signal to control all transistors TFT of the third switching unit group 3 to be turned off simultaneously.

In the third stage t3, each data line of the display panel cannot receive the data signal provided by the corresponding data signal input bus. At this time, each of the pixels positioned in the ($m_1$+1)-th row to the M-th row of the display panel cannot receive corresponding data signal, and the pixels positioned in the ($m_1$+1)-th row to the M-th row of the display panel have a grayscale value of 0.

It can be seen from the above that the display panel may display a specific detection image in which pixels at the central region have the second grayscale value and pixels at the peripheral region have a grayscale value of 0. At this time, a detecting worker may detect whether a crosstalk occurs in the display panel according to the specific detection image displayed by the display panel.

Each of the first and second embodiments of the present invention provides a detecting circuit, which is improved on the basis of conventional detecting circuits used for liquid crystal cell test, so as to enable the detecting circuit to perform a detection of crosstalk on a display panel, such that the detection of crosstalk for the display panel can be performed in an early stage of the manufacture procedure, and thus defective products having crosstalk can be detected in time to solve the technical problem of high production cost of conventional display panels.

The third embodiment of the present invention provides a detecting method, which is used to perform a detection of crosstalk on a display panel, wherein the detecting method is based on the detecting circuit in the first embodiment, and includes the following first to third stages.

In the first stage, all switching units of the first switching unit group are controlled to be turned on simultaneously by the first control unit, and all switching units of the second switching unit group are controlled to be turned on simultaneously by the second control unit.

In the second stage, all switching units of the first switching unit group are controlled to be turned off simultaneously by the first control unit, and all switching units of the second switching unit group are controlled to be turned on simultaneously by the second control unit.

In the third stage, all switching units of the first switching unit group are controlled to be turned on simultaneously by the first control unit, and all switching units of the second switching unit group are controlled to be turned on simultaneously by the second control unit.

It needs to be noted that the description of the stages in the above detecting method may refer to the operation timing shown in FIG. 4 and the corresponding contents in the first embodiment, which is not mentioned herein.

Alternatively, the detecting method includes the following first to third stages.

In the first stage, all switching units of the first switching unit group are controlled to be turned off simultaneously by the first control unit, and all switching units of the second switching unit group are controlled to be turned off simultaneously by the second control unit.

In the second stage, all switching units of the first switching unit group are controlled to be turned on simultaneously by the first control unit, and all switching units of the second switching unit group are controlled to be turned off simultaneously by the second control unit.

In the third stage, all switching units of the first switching unit group are controlled to be turned off simultaneously by the first control unit, and all switching units of the second switching unit group are controlled to be turned off simultaneously by the second control unit.

It needs to be noted that the description of the stages in the above detecting method may refer to the operation timing shown in FIG. 6 and the corresponding contents in the first embodiment, which is not mentioned herein.

The fourth embodiment of the present invention provides a detecting method, which is used to perform a detection of crosstalk on a display panel, wherein the detecting method is based on the detecting circuit in the second embodiment, and includes the following first to third stages.

In the first stage, all switching units of the first switching unit group are controlled to be turned on simultaneously by the first control unit, all switching units of the second switching unit group are controlled to be turned on simultaneously by the second control unit, and all switching units of the third switching unit group are controlled to be turned on simultaneously by the third control unit.

In the second stage, all switching units of the first switching unit group are controlled to be turned off simultaneously by the first control unit, all switching units of the second switching unit group are controlled to be turned on simultaneously by the second control unit, and all switching units of the third switching unit group are controlled to be turned on simultaneously by the third control unit.

In the third stage, all switching units of the first switching unit group are controlled to be turned on simultaneously by the first control unit, and all switching units of the second switching unit group are controlled to be turned on simultaneously by the second control unit, and all switching units of the third switching unit group are controlled to be turned on simultaneously by the third control unit.

It needs to be noted that the description of the stages in the above detecting method may refer to the operation timing shown in FIG. 8 and the corresponding contents in the second embodiment, which is not mentioned herein.

Alternatively, the detecting method includes the following first to third stages.

In the first stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit.

In the second stage, all switching units of the first switching unit group are controlled to be turned on simultaneously by the first control unit, all switching units of the second switching unit group are controlled to be turned off simultaneously by the second control unit, and all switching units of the third switching unit group are controlled to be turned off simultaneously by the third control unit.

In the third stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit.

It needs to be noted that the description of the stages in the above detecting method may refer to the operation timing shown in FIG. 9 and the corresponding contents in the second embodiment, which is not mentioned herein.

The fifth embodiment of the present invention provides a display device, which includes a detecting circuit used to perform a detection of crosstalk on a display panel, wherein the detecting circuit may employ a detecting circuit provided by the first embodiment or the second embodiment, of which detailed contents may refer to the description in the first or second embodiment and are not mentioned herein.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A detecting circuit used to perform a detection of crosstalk on a display panel, comprising:
    a plurality of data signal input buses, which are used to provide data signals to corresponding data lines on the display panel, a predetermined number of data lines corresponding to a central region of the display panel constituting a first data line group;
    a plurality of switching units, which have the same number as the data lines and correspond to the data lines one to one, the switching units being arranged between the data lines and corresponding data signal input buses, being used to control electrical connections between the data lines and the corresponding data signal input buses, all switching units being divided into at least two switching unit groups, and all switching units in correspondence with the data lines in the first data line group constituting a first switching unit group; and
    a plurality of control units, which have the same number as the switching unit groups and correspond to the switching unit groups one to one, and are used to control all switching units of corresponding switching unit groups to be turned on or turned off simultaneously.

2. The detecting circuit according to claim 1, wherein all switching units are divided into first and second switching unit groups, all switching units corresponding to the data lines of the first data line group constitute the first switching unit group and the remaining switching units constitute the second switching unit group;
    the control units include a first control unit and a second control unit;
    the first control unit is used to control all switching units of the first switching unit group to be turned on or turned off simultaneously; and
    the second control unit is used to control all switching units of the second switching unit group to be turned on or turned off simultaneously.

3. The detecting circuit according to claim 1, wherein all switching units are divided into first, second and third switching unit groups;
    all switching units corresponding to the data lines of the first data line group constitute the first switching unit group, all switching units corresponding to the data lines which correspond to a peripheral region at one side of the central region of the display panel constitute the second switching unit group, and all switching units corresponding to the data lines which correspond to a peripheral region at the other side of the central region of the display panel constitute the third switching unit group;
    the control units include a first control unit, a second control unit and a third control unit;
    the first control unit is used to control all switching units of the first switching unit group to be turned on or turned off simultaneously;
    the second control unit is used to control all switching units of the second switching unit group to be turned on or turned off simultaneously; and
    the third control unit is used to control all switching units of the third switching unit group to be turned on or turned off simultaneously.

4. The detecting circuit according to claim 1, wherein the switching unit comprises a transistor; and
    a control electrode of the transistor is connected to the corresponding control unit, a first electrode of the transistor is connected to the corresponding data line, and a second electrode of the transistor is connected to the corresponding data signal input bus.

5. A detecting method used to perform a detection of crosstalk on a display panel and based on a detecting circuit, wherein the detecting circuit is the detecting circuit according to claim 2, and the detecting method comprises:
    in a first stage, all switching units of the first switching unit group are controlled to be turned on simultaneously by the first control unit, and all switching units of the second switching unit group are controlled to be turned on simultaneously by the second control unit;

in a second stage, all switching units of the first switching unit group are controlled to be turned off simultaneously by the first control unit, and all switching units of the second switching unit group are controlled to be turned on simultaneously by the second control unit; and in a third stage, all switching units of the first switching unit group are controlled to be turned on simultaneously by the first control unit, and all switching units of the second switching unit group are controlled to be turned on simultaneously by the second control unit.

6. A detecting method used to perform a detection of crosstalk on a display panel and based on a detecting circuit, wherein the detecting circuit is the detecting circuit according to claim 2, and the detecting method comprises:

in a first stage, all switching units of the first switching unit group are controlled to be turned off simultaneously by the first control unit, and all switching units of the second switching unit group are controlled to be turned off simultaneously by the second control unit;

in a second stage, all switching units of the first switching unit group are controlled to be turned on simultaneously by the first control unit, and all switching units of the second switching unit group are controlled to be turned off simultaneously by the second control unit; and in a third stage, all switching units of the first switching unit group are controlled to be turned off simultaneously by the first control unit, and all switching units of the second switching unit group are controlled to be turned off simultaneously by the second control unit.

7. A detecting method used to perform a detection of crosstalk on a display panel and based on a detecting circuit, wherein the detect circuit is the detect circuit according to claim 3, and the detecting method comprises:

in a first stage, all switching units of the first switching unit group are controlled to be turned on simultaneously by the first control unit, all switching units of the second switching unit group are controlled to be turned on simultaneously by the second control unit, and all switching units of the third switching unit group are controlled to be turned on simultaneously by the third control unit;

in a second stage, all switching units of the first switching unit group are controlled to be turned off simultaneously by the first control unit, all switching units of the second switching unit group are controlled to be turned on simultaneously by the second control unit, and all switching units of the third switching unit group are controlled to be turned on simultaneously by the third control unit; and in a third stage, all switching units of the first switching unit group are controlled to be turned on simultaneously by the first control unit, all switching units of the second switching unit group are controlled to be turned on simultaneously by the second control unit, and all switching units of the third switching unit group are controlled to be turned on simultaneously by the third control unit.

8. A detecting method used to perform a detection of crosstalk on a display panel and based on a detecting circuit, wherein the detecting circuit is the detecting circuit according to claim 3, and the detecting method comprises:

in a first stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit;

in a second stage, all switching units of the first switching unit group are controlled to be turned on simultaneously by the first control unit, all switching units of the second switching unit group are controlled to be turned off simultaneously by the second control unit, and all switching units of the third switching unit group are controlled to be turned off simultaneously by the third control unit; and in a third stage, all switching units of the first switching unit group are controlled to be turned off simultaneously by the first control unit, all switching units of the second switching unit group are controlled to be turned off simultaneously by the second control unit, and all switching units of the third switching unit group are controlled to be turned off simultaneously by the third control unit.

9. A display device, comprising the detecting circuit according to claim 1.

* * * * *